(12) United States Patent
Fackenthal et al.

(10) Patent No.: US 12,271,262 B2
(45) Date of Patent: *Apr. 8, 2025

(54) DATA RECOVERY SYSTEM FOR MEMORY DEVICES

(71) Applicant: Micron Technology, Inc., Boise, ID (US)

(72) Inventors: Richard Edward Fackenthal, Carmichael, CA (US); Sean Stephen Eilert, Penryn, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/858,579

(22) Filed: Jul. 6, 2022

(65) Prior Publication Data

US 2022/0342748 A1 Oct. 27, 2022

Related U.S. Application Data

(63) Continuation of application No. 17/116,969, filed on Dec. 9, 2020, now Pat. No. 11,403,169.

(51) Int. Cl.
*G06F 11/10* (2006.01)
*G06F 12/0804* (2016.01)

(52) U.S. Cl.
CPC ........ *G06F 11/102* (2013.01); *G06F 12/0804* (2013.01); *G06F 2212/1032* (2013.01); *G06F 2212/403* (2013.01)

(58) Field of Classification Search
CPC .............. G06F 11/102; G06F 12/0804; G06F 2212/1032; G06F 2212/403
See application file for complete search history.

(56) References Cited

U.S. PATENT DOCUMENTS

| | | | |
|---|---|---|---|
| 8,977,929 B2 | 3/2015 | Thiruvengadam et al. | |
| 11,403,169 B2 | 8/2022 | Fackenthal et al. | |
| 2009/0122589 A1* | 5/2009 | Chang ................. | G11C 29/027 365/96 |
| 2013/0332799 A1* | 12/2013 | Cho .................... | G06F 11/1012 714/764 |
| 2015/0149855 A1 | 5/2015 | Alhussien et al. | |
| 2017/0257121 A1 | 9/2017 | Kwok | |
| 2017/0271010 A1 | 9/2017 | Kajigaya | |
| 2021/0035653 A1 | 2/2021 | Becker et al. | |
| 2022/0128628 A1* | 4/2022 | Gizdarski ...... | G01R 31/318357 |
| 2022/0179734 A1 | 6/2022 | Fackenthal et al. | |

* cited by examiner

*Primary Examiner* — Daniel F. McMahon

(74) *Attorney, Agent, or Firm* — Greenberg Traurig

(57) ABSTRACT

Systems, methods, and apparatus related to data recovery in memory devices. In one approach, a memory device encodes stored data. The memory device reads a codeword from a storage media and determines that a number errors in the codeword exceeds an error correction capability of the memory device. The errors are due, for example, to one or more stuck bits. In response to this determination, one or more data patterns are written to the storage media at the same address from which the codeword is read. The data patterns are read to identify bit locations of the stuck bits. The identified locations are used to correct bit errors of the read codeword that correspond to the identified locations. The corrected code word is sent to a host device (e.g., which requested data from the memory device using a read command).

20 Claims, 7 Drawing Sheets

DATA RECOVERY SYSTEM FOR MEMORY DEVICES

RELATED APPLICATIONS

The present application is a continuation application of U.S. patent application Ser. No. 17/116,969 filed Dec. 9, 2020, the entire disclosure of which application is hereby incorporated herein by reference.

FIELD OF THE TECHNOLOGY

At least some embodiments disclosed herein relate to memory devices in general, and more particularly, but not limited to data recovery for errors that occur in data stored in memory devices.

BACKGROUND

In some cases, errors can repeatedly occur when writing data to memory. For example, memories can exhibit so-called static or hard errors in memory cells. A hard error can refer to a repeatable error that consistently returns incorrect data. Some hard errors can result from a memory cell getting stuck in a particular state (e.g., an error due to a stuck bit).

As one example, a binary memory cell with a hard error can return a logical 0 value regardless of whether a logical 0 or a logical 1 is written to the memory cell. In this example, the memory cell with the hard error encounters the same failure when reading data from the memory cell. More specifically, a memory cell stuck in a logical 0 state will encounter failures of reading a logical 0 when trying to read a logical 1 written to the memory cell.

Hard errors can occur in various types of memories, such as phase-change memory (PCM), also known as PCRAM or PRAM. PCM is a form of non-volatile memory made from a phase-change material. An example of a phase-change material is Germanium-Antimony-Tellurium (GST). When a cell of GST material is heated beyond its melting point and cools relatively rapidly, the phase-change material of the cell is in an amorphous state and can have a resistance associated with a first state, such as logic 0. When the cell of GST material is heated and is cooled relatively slowly, the phase-change material of the cell is in a crystalline state and can have a resistance associated with a second state, such as logic 1. The cell of GST material can also be heated to a relatively lower temperature, such as a temperature associated with crystallization to achieve the crystalline state. Intermediate states are also possible for multi-level cells.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
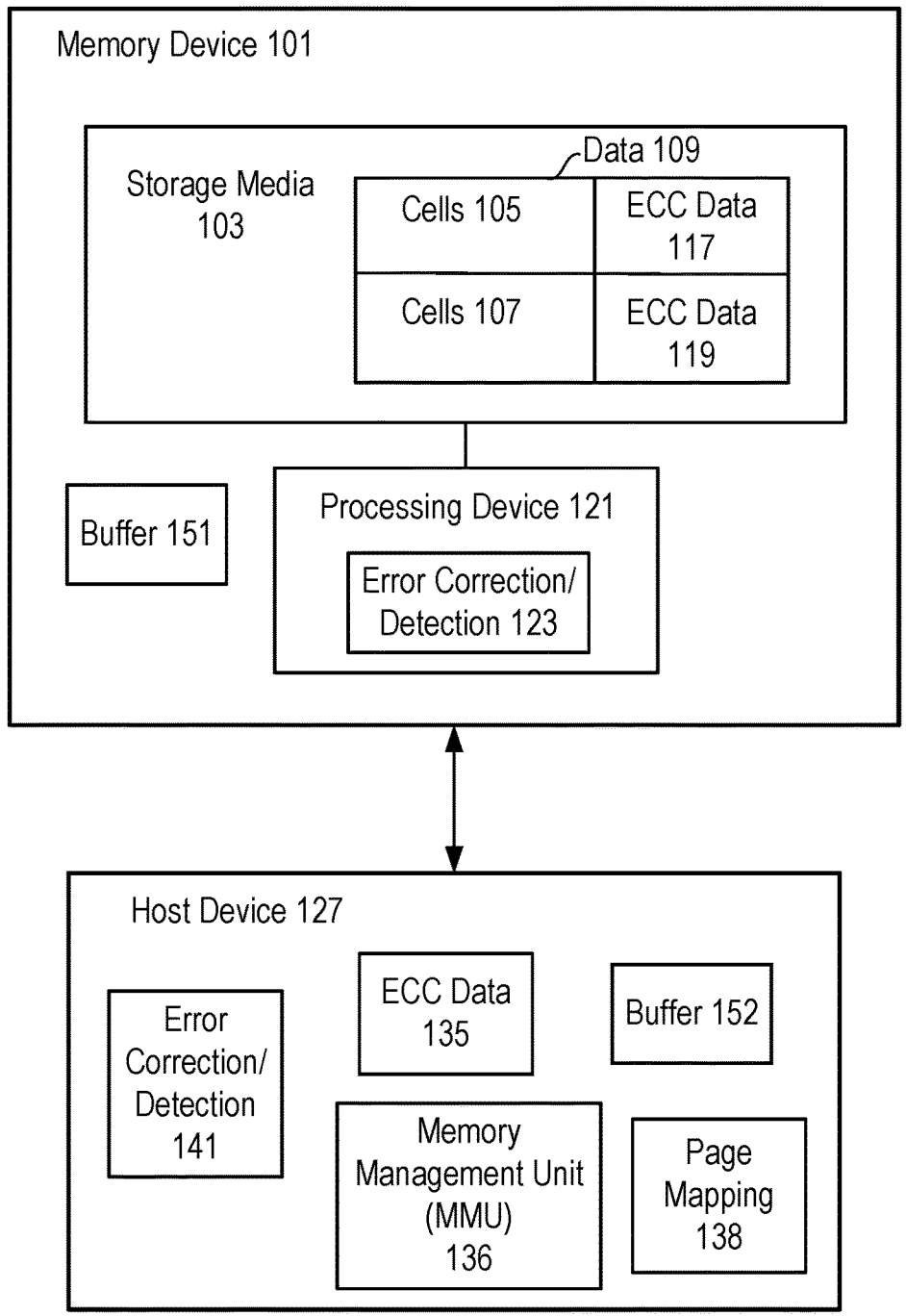
FIG. 1 shows a system that implements data recovery for errors that occur in data stored in a memory device, in accordance with some embodiments.

The following disclosure describes various embodiments for data recovery systems to correct errors that occur in data stored in memory devices. At least some embodiments herein relate to stuck bits or other failing bits that cause bit errors in data read from a memory (e.g., a memory array) of a memory device. In one example, the memory device may be any of various types of volatile or non-volatile memory devices (e.g., a storage device). In some examples, the memory device can use phase change memory (PCM), and/or NAND flash memory. The memory device may, for example, store data used by a host device (e.g., a computing device of an autonomous vehicle, or another computing device that accesses data stored in the memory device). In one example, the memory device is a solid-state drive. Other types of memory devices may include devices using random access memory (RAM), dynamic RAM (DRAM), synchronous dynamic RAM (SDRAM), ferroelectric RAM (Fe-RAM), magnetic RAM (MRAM), and resistive RAM (RRAM).

Memory devices sometimes include an error correction capability. For example, when storing data, a memory device may implement an error correction code (ECC) to identify and correct errors. However, the capacity for error correction can often be significantly limited (e.g., a 3-bit error correction capability). If the number of errors that occur when reading data from a memory exceeds the error correction capacity (e.g., 4 bit errors or more), then the memory device is unable to fully correct the data. For example, this prevents the memory device from sending proper, correct data to a host device that has sent a read command to the memory device. Failure to send correct data to the host device can cause software executing on the host device to fail.

In one example, the host device executes software that controls the operation of an autonomous vehicle. Failure of a memory device to send correct data to the host device can cause the vehicle to crash or fail. This can cause physical damage and/or personal injury.

To address these and other technical problems, data recovery systems and methods for use in memory devices are described herein. The data recovery is performed in response to identifying one or more errors in data read from a memory. In response to detecting the errors, one or more data patterns (e.g., test patterns of all 1's or all 0's) are selected and written to the memory, and the data patterns are read from the memory to identify the errors in the data.

In one example, the identified errors are caused by stuck bits. For example, a stuck bit can be caused by a defective memory cell in a memory array (e.g., a PCM memory array).

In one embodiment, a memory device determines that data (e.g., a sensed codeword) read from a memory array contains errors. These errors include one or more errors due to stuck bits that have appeared during the life of the memory device while in the field. For example, these errors may appear one or more years after manufacture of the memory device.

The number of errors is determined to be greater than the error correction capability of the memory device, but the detection of the errors is within the detection capability of the memory device. In one example, the memory device uses an error correction code that is capable of correcting three bits in a codeword, but is able to detect four bits as being defective in the codeword.

In response to determining that the number of detected bit errors in a codeword read from memory is greater than the error correction capability, a data recovery process is initiated to determine the location of failing bits in the codeword. A test data pattern is selected for writing to the same location in which the defective word has been read. The data pattern is then read from the same location. By comparing the bits of the read data pattern to the written data pattern (e.g., to look for bit value mismatches), the location of the failing bits is determined.

If the first data pattern written above cannot be used to identify the failing bits, then the inverse of the data pattern is written to the same location (e.g., all logic 0 values in the first data pattern are inverted to all logic 1 values in a second data pattern). The second, inverse data pattern is then read from the same location, and used to identify the location of the failing bits.

In one embodiment, once the location of the failing bits is identified, the failing bits are flipped in the codeword read from memory. Then, the remaining errors in the codeword are corrected using the error correction capability (e.g., ECC3). The corrected codeword can then be sent to a host device and/or written to the same location in memory so that the memory now stores the proper, correct data.

In another embodiment, first data is read from a location in a memory. The first data is stored in a buffer. One or more errors are detected in the first data. In response to detecting the errors in the first data, a data pattern is written to the location in the memory. The data pattern is read from the location in the memory, and at least one failing bit in the read data pattern is identified. In response to identifying the failing bit, the identified failing bit is corrected in the stored first data to provide corrected data.

In one example, the first data is read from the memory in response to receiving a read command from a host device. The corrected data is sent to the host device in reply to the read command. In another example, the first data may be read during execution of on-die management or other maintenance processes (e.g., wear-leveling) without prompting by or interaction with a host device.

Advantages provided by various embodiments described herein include providing a way for a system to correct more bits than an existing error correction code system would otherwise allow. This is of particular advantage in systems that accept out-of-order memory requests. Another advantage is the ability to correct errors caused by stuck bits while a memory device is being operated in the field.

FIG. 1 shows a system that implements data recovery for errors that occur in data stored in a memory device 101, in accordance with some embodiments. The errors are detected when the data is read from memory. Storage media 103 stores data 109 in the memory cells. These memory cells include cells 105 and cells 107. In one example, cells 105 correspond to a first row in a memory array, and cells 107 correspond to a second row in the memory array. In one example, the memory cells are NAND flash memory cells, or PCM memory cells. In one example, the first row stores a codeword that includes user data and ECC data 117. The ECC data 117 Is obtained from encoding the user data using error correction capability 123. The second row stores a codeword that includes user data and ECC data 119.

In one embodiment, memory device 101 receives a read command from host device 127. In response to receiving the read command, processing device 121 reads data 109, such as a codeword stored in cells 105, from storage media 103. The read codeword is stored in buffer 151. Buffer 151 is, for example, random access memory.

Processing device 121 uses error detection 123 to detect one or more errors in the codeword read from storage media 103. In response to detecting the one or more errors, processing device 121 writes a data pattern to storage media 103 in the same location (e.g., same physical address) from which the codeword is read. For example, the location is an address in a memory array, and the address indicates a row of the memory array that includes cells 105. In one example, one of the errors detected in the codeword is due to a defective phase change memory (PCM) or flash memory cell 105.

In one example, the data pattern written is a pattern of bits in which each bit is a logical 0. The data pattern is then read from the same location in memory to which the data pattern was written. The read data pattern is compared bit-by-bit to the written data pattern. If a read bit has a different logical value then the written bit, then the location of a failing bit is identified. In some cases, more than one failing bit location can be identified.

In response to identifying the one or more failing bits, which includes determination of the location of the failing bits, the codeword stored in buffer 151 is corrected by flipping the logical value of the bit at the bit location(s) corresponding to the identified failing bit(s).

In some cases, the first data pattern (e.g., all logical 0's) read from the memory fully matches the written first data pattern, and is not usable to identify a failing bit. In this case, a second data pattern is written to the memory location. The second data pattern is an inverse of the first data pattern (e.g., all logical 1's). Comparison of the read second data pattern to the written second data pattern reveals one or more failing bits (e.g., locations of stuck bits that correspond to bit locations in the read codeword).

In some embodiments, data recovery to correct errors in data stored in memory device 101 is alternatively and/or additionally implemented by host device 127. In one embodiment, a codeword is read from storage media 103 and stored in buffer 152 of host device 127. The codeword includes ECC data 135, which is used by error detection 141 to identify one or more errors in the codeword. For example, error detection 141 detects a number of errors in the codeword that exceeds a correction capability of error correction 141. In one example, ECC data 135 includes ECC data 117.

In response to detecting a number of errors that exceeds the correction capability, host device 127 selects a first data pattern for writing to the same address in memory device 101 from which the codeword was read. For example, the first data pattern can be all logical 1's or 0's. For example, the first data pattern can be a random or arbitrary mixture of logical 1's or 0's. For example, the first data pattern can be selected based on a context of operation of memory device 101 (e.g., an age of the memory device 101 and/or a temperature of operation of memory device 101).

After the first data pattern is selected, host device 127 causes the first data pattern to be written to the same address from which the codeword was read. Host device 127 then reads the first data pattern from this same address. Host device 127 compares the written pattern to the read pattern, and determines that the read first pattern does not indicate any failing bits in storage media 103.

In response to this determination, host device 127 selects a second data pattern. For example, the second data pattern is an inverse of the first data pattern. For example, the second data pattern is selected based on one or more characteristics of operation of memory device 101 as determined from writing and/or reading the first data pattern. For example, the second data pattern can be selected additionally and/or alternatively based on a context of operation of memory device 101.

Host device 127 causes the second data pattern to be written to the same address from which the codeword was read. Host device 127 reads the second data pattern. Based on reading the second data pattern, host device 127 identifies one or more bit errors and corresponding bit locations of these errors.

Host device 127 uses the identified bit errors and corresponding bit locations to correct one more bit errors in the codeword stored in buffer 152. For example, host device 127 determines that there is a stuck bit at bit location 23 of 128 bits in the codeword. Host device 127 changes the logical value of bit location 23 in the stored codeword (e.g., by flipping the value from 0 to 1).

After correcting errors in the codeword based on reading the second data pattern, host device 127 uses error correction 141 and ECC data 135 to correct other errors in the codeword. The corrected codeword is then available for further use by host device 127 and/or memory device 101. In one example, host device 127 writes the corrected codeword to the same location in memory device 101 from which the codeword was initially read prior to error correction.

In one embodiment, various data patterns can be selected. In one example, each data pattern is selected for a particular write operation to store data in the memory. In one example, the data pattern is alternating zeros and ones, or ones and zeros. In one example, the data pattern is selected such that correctable bits are first corrected prior to writing the data pattern to the memory so that the number of identified failing bits is reduced (e.g., in order to more readily identify a stuck bit).

In one embodiment, host device 127 includes memory management unit (MMU) 136, which maintains logical-to-physical address mappings for data stored in memory device 101. In one example, mapping for pages stored in memory device 101 as data 109 is stored as page mapping 138 by host device 127. MMU 136 updates page mapping 138 during operation of host device 127.

In one example, after determining the existence of one or more failing bits associated with a page stored in storage media 103, MMU 136 updates page mapping 138 to change the mapping of the page to a different physical location in storage media 103. In one example, instead of changing the page mapping for the defective page, MMU retires the page.

In one embodiment, memory device 101 is a flash memory device, and error correction codes are used in the flash memory device to recover stored data if an error is detected. In one example, the error correction code supplements user data with parity bits that store additional information so that the data can be recovered if one or more data bits are corrupted. The number of data bit errors that can be corrected in the store data increases as the number of error bits in the error correction code increases.

In the flash memory device above, the user data is stored in a memory location (e.g., at a physical address of a memory array implemented using storage media 103) of the memory device along with the error correction code information (e.g., ECC data 117) for the user data. The user data and ECC data are written to the memory location in a single write operation, or read from the memory location in a single read operation. The error correction code is implemented by a controller or other processing device of the flash memory device.

In one example, the error correction code generates parity bits that are stored with the user data. In various examples, the error correction code can be based on a Hamming coding scheme, a Reed-Solomon coding scheme, a turbo code coding scheme, or a low-density parity check (LDPC) coding scheme.

In one embodiment, data recovery as described above can be implemented by a system (e.g., a host device or memory controller) that manages the data recovery at the system level. For example, the system recognizes corrupted data, and determines whether to initiate a data recovery process (e.g., a number of errors detected in a codeword exceeds a threshold determined by a host device or controller).

In one example, a system that implements data recovery uses Compute Express Link (CXL) for communication between the host device or controller and the memory device (e.g., memory device 101) in which data is stored. For example, Compute Express Link (CXL) is an interconnection that provides high-speed central processing unit (CPU) CPU-to-device and CPU-to-memory communication (e.g., to accelerate data center performance). CXL is built on the PCI Express (PCIe) physical and electrical interface with protocols in three areas: input/output (I/O), memory, and cache coherence.

In one embodiment, other systems that can be used to implement data recovery as described above include a host system attached to a memory sub-system (e.g., memory device 101) using interconnect. For example, one type of suitable interconnect is described by the Cache Coherent Interconnect for Accelerators (CCIX) standard, which enables hardware accelerators and processors to maintain cache coherency across shared memory in a heterogeneous multi-processor system. For example, the CCIX interface enables coherent interconnect between general-purpose processors and acceleration devices for heterogeneous computing. CCIX enables interconnect focused on acceleration applications such as machine learning, network processing, storage off-load, in-memory database, and 4G/5G wireless technology.

For example, the CCIX interconnect allows processors based on different instruction set architectures to extend the benefits of cache coherent, peer processing to a number of acceleration devices including, for example, FPGAs, GPUs, network/storage adapters, intelligent networks, and custom ASICs.

Figure 2:
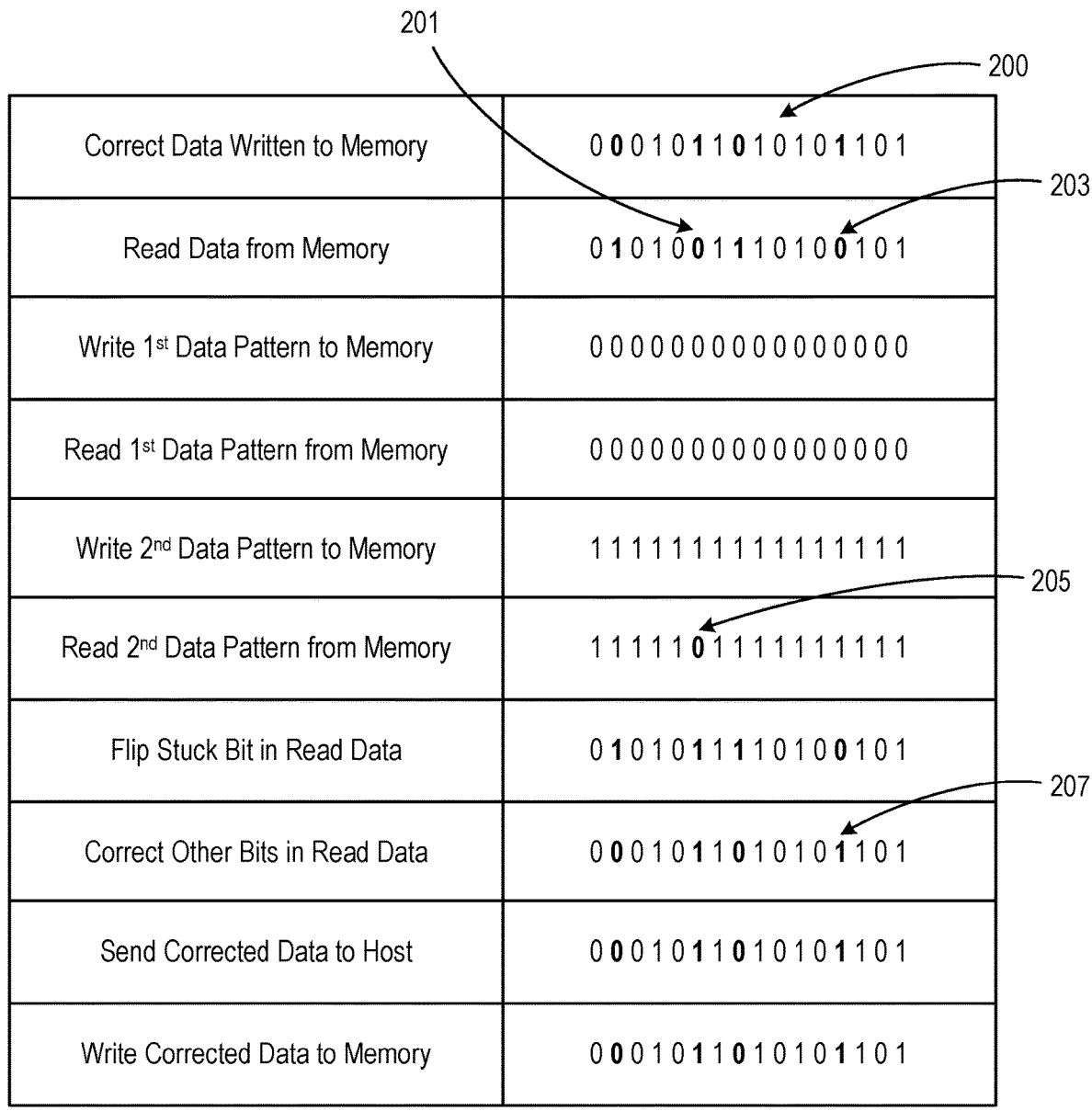
FIG. 2 shows an example of correcting data to recover from errors in data stored in memory, in accordance with some embodiments.

FIG. 2 shows an example of correcting data to recover from errors in data stored in memory, in accordance with some embodiments. In the illustrated example, the correct data written to memory initially (e.g., at a time prior to receiving a read command from a host device) is illustrated as data 200. In one example, data 200 is the correct data previously written to storage media 103 of memory device 101 in response to previously receiving a write command from host device 127.

In an initial step, data is read from memory (e.g., in response to a read command from host device 127 or processing device 121). The data includes one or more errors. For example, the logical value of bits 201 and 203 are incorrect when compared to correct data 200. In one example, these errors in the read the data are determined as discussed above. The data read from the memory is saved (e.g., stored in buffer 151 or 152).

As discussed above, a first data pattern is selected, as illustrated. This data pattern is written to memory. Then, the data pattern is read from memory. In the illustrated example, the write data pattern and the read data pattern are identical. Thus, no stuck bit is identified.

In response to failing to identify any stuck bit using the first data pattern, a second data pattern is selected, such as described above. As illustrated, the second data pattern is an inverse of the first data pattern.

The second data pattern is written to the memory, such as discussed above. Then, the second data pattern is read from the memory. Based on reading the second data pattern, stuck bit 205 is identified, including the bit location in memory of the stuck bit.

The identification of the stuck bit 205 is used to flip the bit in the saved read data (e.g., a codeword read from memory and stored in buffer 151 or 152). For example, the logical value of the bit in the read data at the identified bit location is inverted, as illustrated.

The other bit errors in the read data from memory are corrected. For example, bit 207 is corrected to match data 200. In one example, bit 207 and other bits are corrected using an error correction code (e.g., correction using error correction 123 or 141 based on ECC data 117 or 119).

After correction of the stuck bit and the other bits in the read data, corrected data is provided that can be further used by a computer system. For example, the corrected data can be sent to a host (e.g. host device 127 or processing device 121). For example, the corrected data can additionally and/or alternatively be written to memory at the same location from which the read data was initially obtained from the memory.

In one embodiment, a data recovery manager is implemented by a computing system to correct more bits than is possible by an error correction code used by the computing system. The computing system accepts out-of-order memory requests.

Figure 3:
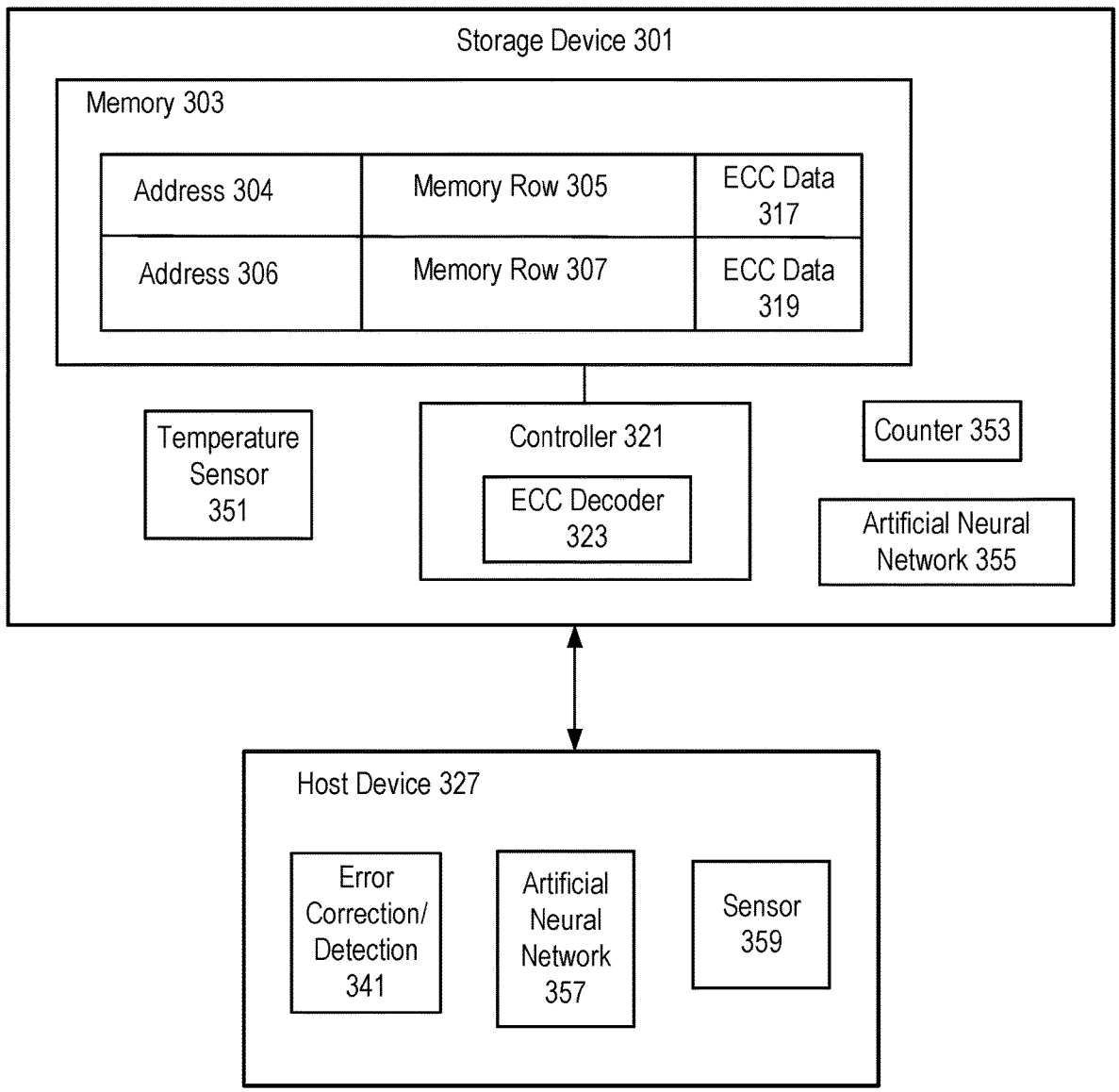
FIG. 3 shows a system that implements data recovery for memory of a storage device based on a context of operation, in accordance with some embodiments.

FIG. 3 shows a system that implements data recovery for memory of a storage device 301 based on a context of operation, in accordance with some embodiments. Storage device 301 includes memory 303, in which data is stored at various addresses 304, 306. For example, data is stored in memory row 305 at address 304. ECC data 317 is stored with corresponding user data in memory row 305. Similarly, data is stored in memory row 307 at address 306. ECC data 319 is stored with corresponding user data in memory row 307. In one example, storage device 301 is an example of memory device 101.

In one example, addresses 304, 306 are physical addresses of a memory array. In one example, physical addresses 304, 306 correspond to logical addresses for pages of data stored in page mapping 138 and managed by MMU 136.

Controller 321 executes a data recovery management process (e.g., using a data recovery manager of firmware stored in memory of storage device 301) to detect errors for data stored in memory 303, and to correct one or more of the identified errors. Some of the errors are corrected by ECC decoder 323 using ECC data 317, 319. In some cases, read data from memory 303 has a number of errors that exceeds an error correction capability of ECC decoder 323. In response to determining that the number of errors exceeds the error correction capability, one or more data patterns can be selected and written to memory 303, such as discussed above. Reading of these data patterns can be used to identify and correct stuck bits in, for example, memory rows 305, 307.

Host device 327 communicates with storage device 301, for example, over a serial bus or other interconnect (e.g., CXL or CCIX interconnect). Host device 327 is an example of host device 127. In some cases, data recovery management is controlled by host device 327 alternatively and/or additionally to controller 321. As part of data recovery, host device 327 detects errors using error detection 341 (e.g., parity checks, CRC, comparing of hash values, etc.). Also, host device 327 corrects some errors using error correction 341 (e.g., ECC1 or ECC3).

As mentioned above, in response to detecting one or more errors in the read data, one or more data patterns are selected. In some embodiments, each respective data pattern is selected based on a context of operation of storage device 301, host device 327, and/or another system that uses data from storage device 301. The context at the time of selection determines the pattern.

Storage device 301 includes temperature sensor 351, counter 353, and artificial neural network 355. Temperature sensor 351 provides sensor data to controller 321 regarding a temperature associated with memory 303. Controller 321 can use the sensor data for selecting a data pattern to write to memory 303.

Counter 353 can be used to record activities associated with various locations and/or memory cells in memory 303. For example, counter 353 can record programming cycles performed for each of several respective blocks in a flash memory device. When selecting a data pattern for writing to a location to memory 303, a value of counter 353 associated with the location can be used for selecting the data pattern. For example, counter 353 may indicate an extensive programming of a block. A data pattern for writing to the block is selected based on the value of the counter 343 corresponding to that block.

In one embodiment, an output from artificial neural network (ANN) 355 can be used by controller 321 for selecting the data pattern. Inputs to ANN 355 can include operating characteristics and/or history associated with memory 303. Other inputs can include sensor data from temperature sensor 351 and/or values from counter 353. In one embodiment, an input to ANN 355 can include an age of storage device 301.

In one embodiment, host device 327 includes sensor 359 and/or ANN 357. For example, sensor 359 may be a temperature sensor, or another type of sensor. Host device 327 can use an output from ANN 357 for selecting a data pattern to be written to memory 303. Data from sensor 359 can be an input to ANN 357. In one example, the inputs to ANN 357 may also include one or more of the inputs described above for ANN 355. In one example, host device 327 executes software to implement a data recovery manager that uses an output from ANN 357 for selecting data patterns to write to memory 303 as part of correcting errors due to stuck bits, such as described above.

In some embodiments, additionally and/or alternatively, characteristics associated with writing the data pattern and/or reading the data pattern are changed. In one example, a timing associated with reading the data pattern is changed. In one case, the read operation for reading the data pattern is performed more slowly than read operations normally performed for reading data. In one example, the codeword is read from a memory array using a first access time associated with the normal mode of operation. However, data patterns used to detect failing bits are read using a different mode of operation in which the read access time is longer (e.g., the read operation is slower).

Figure 4:
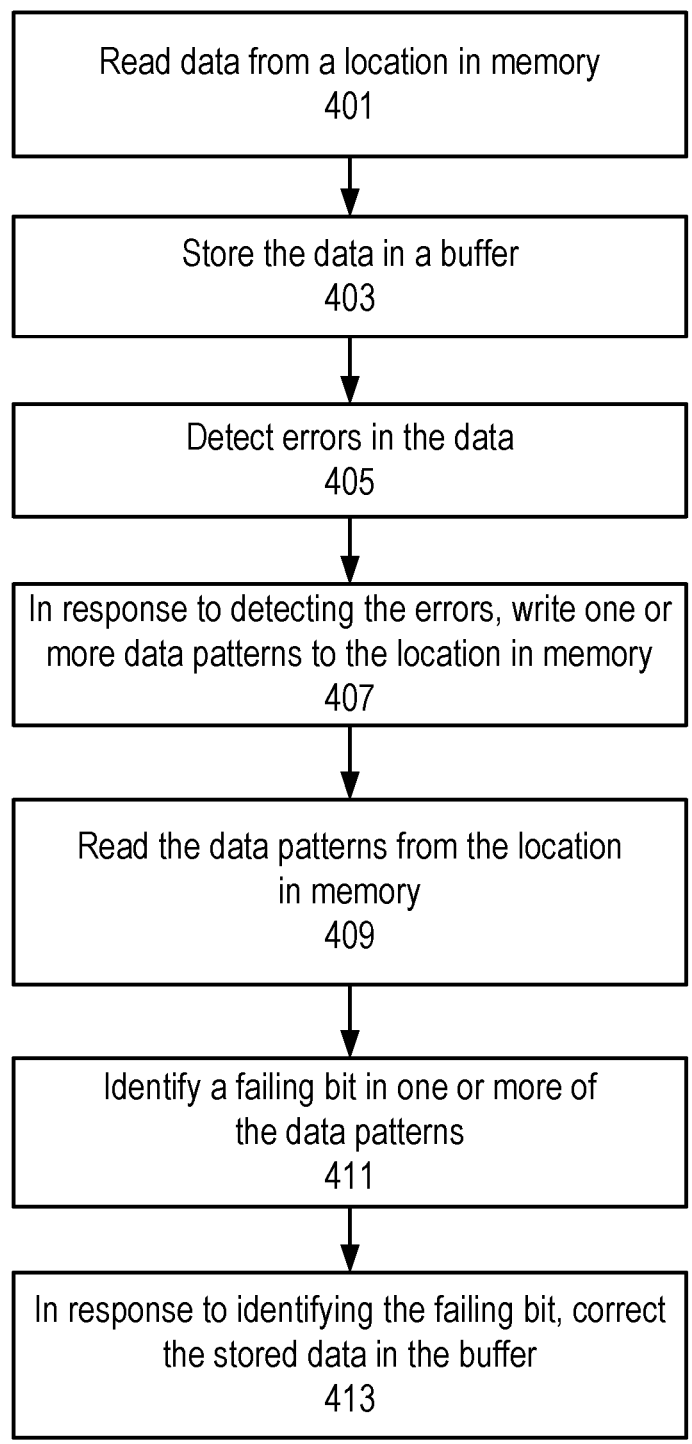
FIG. 4 shows a method for correcting errors in data stored in a memory by using one or more data patterns, in accordance with some embodiments.

FIG. 4 shows a method for correcting errors in data stored in a memory by using one or more data patterns, in accordance with some embodiments. For example, the method of FIG. 4 can be implemented in the system of FIG. 1. In one example, the memory is phase change memory or flash memory.

The method of FIG. 4 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 4 is performed at least in part by one or more processing devices (e.g., processing device 121 or host device 127 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 401, data is read from a location in memory. In one example the data is read from address 304 of memory 303.

At block 403, the data read from the memory is stored in a buffer or otherwise saved for later use. In one example, the read data stored in buffer 151 and/or 152.

At block 405, one or more errors are detected in the data read from the memory. In one example, four bit errors are detected in a read codeword by a memory device that implements ECC capable of only correcting up to a maximum of three bit errors.

At block 407, in response to detecting the errors, one or more data patterns are selected and written to the location in the memory from which the data was read. In one example, a memory controller or host device determines that a number of bit errors detected exceeds an error correction capability. In response, the controller or host device selects and writes a first data pattern, such as described above. Based on reading the first data pattern, and/or a determined context (e.g., using ANN 355), the controller or host device selects and writes a second data pattern.

At block 409, the one or more data patterns are read from the location in memory. In one example, a first data pattern, and then a second data pattern, such as described above, are read from storage media 103.

At block 411, one or more failing bits is identified in one or more of the data patterns (e.g., based on reading the second data pattern). In one example, the failing bit is a stuck bit corresponding to a defective cell in memory cells 105 of storage media 103.

At block 413, in response to identifying the one or more failing bits, the data stored in the buffer (or otherwise saved) is corrected. In one example, the corrected data is sent to a host device for which a read command has been received by the memory. In one example, the corrected data is additionally written to the location in the memory so it is available for future use (e.g., a future read command to same data).

In one embodiment, a system includes: at least one memory configured to store data in memory cells (e.g., 105, 107); a buffer (e.g., 151, 152) configured to store data read from the memory cells; and at least one processing device (e.g., controller 321, or a processor of host device 127) configured to: read first data from a location (e.g., address 304, 306) in the memory; store the first data in the buffer; detect one or more errors in the first data; in response to detecting the errors in the first data, write a data pattern (e.g., the first or second data pattern illustrated in FIG. 2) to the location in the memory; read the data pattern from the location in the memory; identify at least one failing bit (e.g., a stuck bit) in the read data pattern; and in response to identifying the failing bit, correcting the identified failing bit in the stored first data to provide corrected data.

In one embodiment, the first data is read in response to receiving a read command from a host device (e.g., 127), and the processing device is further configured to send the corrected data to the host device in reply to the read command.

In one embodiment, the errors detected in the first data include an error caused by the failing bit, and at least one other bit error; and the processing device is further configured to correct the other bit error using an error correction code prior to sending the corrected data to the host device.

In one embodiment, detecting the errors in the first data includes detecting the errors using an error correction code (e.g., ECC implemented by error correction 123, 141 or error correction 341), and determining that the detected errors exceed a correction capability of the error correction code; and the processing device is further configured to write the corrected data to the location in the memory.

In one embodiment, the system further includes an error correction code (ECC) decoder (e.g., 323), where the ECC decoder is configured to detect the errors in the first data.

In one embodiment, the identified failing bit is a stuck bit, and the processing device is further configured to: determine a bit location of the stuck bit in the read data pattern; determine a state of the stuck bit in the read data pattern; determine a state of a bit at the bit location in the first data; and determine that the state (e.g., value of bit is a logical zero) of the stuck bit in the read data pattern matches the state of the bit in the first data.

In one embodiment, the failing bit is a stuck bit due to a defective one of the memory cells from which the first data is read.

In one embodiment, the system further includes at least one sensor (e.g., temperature sensor 351, and/or sensor 359), where the processing device is further configured to: receive sensor data from the sensor; and select, based on the sensor data, the data pattern for writing to the location in the memory.

In one embodiment, the processing device is further configured to, in response to detecting the errors in the first data, change a timing for at least one of writing the data pattern, or reading the data pattern (e.g., using a mode of slower read operation for reading the data pattern, where the read operation is performed more slowly than a normal mode of reading data from the memory).

Figure 5:
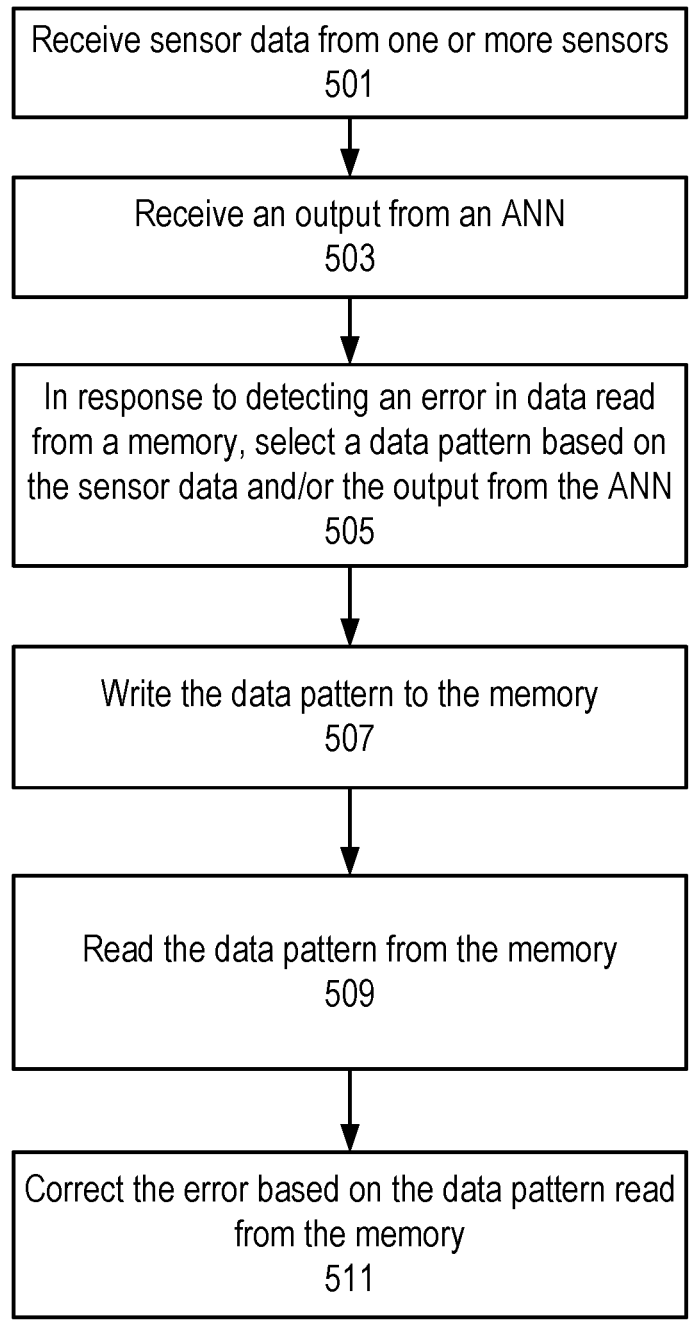
FIG. 5 shows a method for correcting errors in stored data based on sensor data and/or output from an artificial neural network, in accordance with some embodiments.

FIG. 5 shows a method for correcting errors in stored data based on sensor data and/or output from an artificial neural network, in accordance with some embodiments. For example, the method of FIG. 5 can be implemented in the system of FIG. 3. In one example, the memory is a storage device 301 used in an autonomous vehicle. Data stored in memory 303 (e.g., one or more non-volatile memory die) is used by host device 327 to control navigation and motor or engine functions of the vehicle.

The method of FIG. 5 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 5 is performed at least in part by one or more processing devices (e.g., controller 321 of FIG. 3).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 501, sensor data is received from one or more sensors. In one example, sensor data is received by controller 321 from temperature sensor 351. The sensor data is used to determine a temperature associated with memory 303.

At block 503, an output is received from an artificial neural network (ANN). In one example, controller 321 receives data from one or more sensors of storage device 301, sensors of host device 327, and/or sensors of a system controlled by host device 327, such as an autonomous vehicle. The data received by control 321 is used as an input to the ANN (e.g., ANN 355). Other inputs to the ANN can include values from counter 353, and/or an age (e.g., time length of service) of storage device 301 or a time of use of various respective portions of a storage media (e.g., storage media of different types of die) of memory 303.

At block 505, an error is detected in data read from a memory. In response to detecting the error, a data pattern is selected. The data pattern is selected based on the sensor data and/or the output from the ANN. In one example, the data pattern is selected to correspond to a type of storage media (e.g., types of materials used to store data in memory cells of the storage media). In one example, the data pattern is selected to correspond to an age or an extent of use of the storage media.

At block 507, the selected data pattern is written to the memory. In one example, the data pattern is written to the same address from which the data having the detected error is read from the memory.

At block 509, the data pattern is read from the memory. In one example, one or more stuck bits are identified in the read data pattern. The bit locations of the stuck bits are identified.

At block 511, the error in the data read from the memory is corrected based on the data pattern read from the memory. In one example, the identified bit locations are used to correct corresponding bits in the read data at the same bit locations.

In one embodiment, a non-transitory computer-readable medium stores instructions which, when executed on at least one processing device, cause the at least one processing device to, in response to receiving a read command from a host device (e.g., 327): read data from memory (e.g., memory 303 or storage media 103); detect an error in the read data; in response to detecting the error, write at least one data pattern to the memory; read the data pattern from the memory; identify, based on reading the data pattern, at least one stuck bit; in response to identifying the stuck bit, correct the read data to provide corrected data; and send the corrected data to the host device.

In one embodiment, the instructions further cause the at least one processing device to: determine an age or extent of use (e.g., as determined based on a value read by controller 321 from counter 353 for a respective portion of memory to which a test data pattern will be written) of the memory based on at least one of a counter, or an output from an artificial neural network (e.g., 355); and select, based on the determined age or extent of use, the data pattern for writing to the memory.

In one embodiment, a method includes: reading data from a location in a memory; detecting an error in the read data; in response to detecting the error, writing at least one data pattern to the location in the memory; reading the data pattern from the location in the memory; identifying, based on reading the data pattern, at least one bit error; and in response to identifying the bit error, correcting the bit error in the read data to provide corrected data.

In one embodiment, the method further includes writing the corrected data to the location in the memory.

In one embodiment, the corrected data includes one or more other bit errors, the method further includes correcting the other bit errors prior to writing the corrected data.

In one embodiment, the identified bit error in the read data pattern is a stuck bit, and the other bit errors are corrected using an error correction code (ECC).

In one embodiment, the read data is included in a page of data read from the memory, and the method further includes: in response to identifying the bit error, changing a mapping of the page (e.g., page mapping 138), or retiring the page.

In one embodiment, the memory is included in a memory device; and writing the data pattern is further in response to determining that a number of failed bits in the read data exceeds an error correction capability of the memory device.

In one embodiment, the data is read from the location in the memory in response to receiving a read command from a host device, and the method further includes sending the corrected data to the host device in reply to the read command.

In one embodiment, writing the data pattern includes writing a first pattern, and writing a second pattern; reading the data pattern includes reading the first pattern, and reading the second pattern; writing the second pattern is performed in response to determining that the read first pattern does not include bit errors; and identifying the bit error is based on reading the second pattern.

In one embodiment, the second pattern is an inverse of the first pattern.

Figure 6:
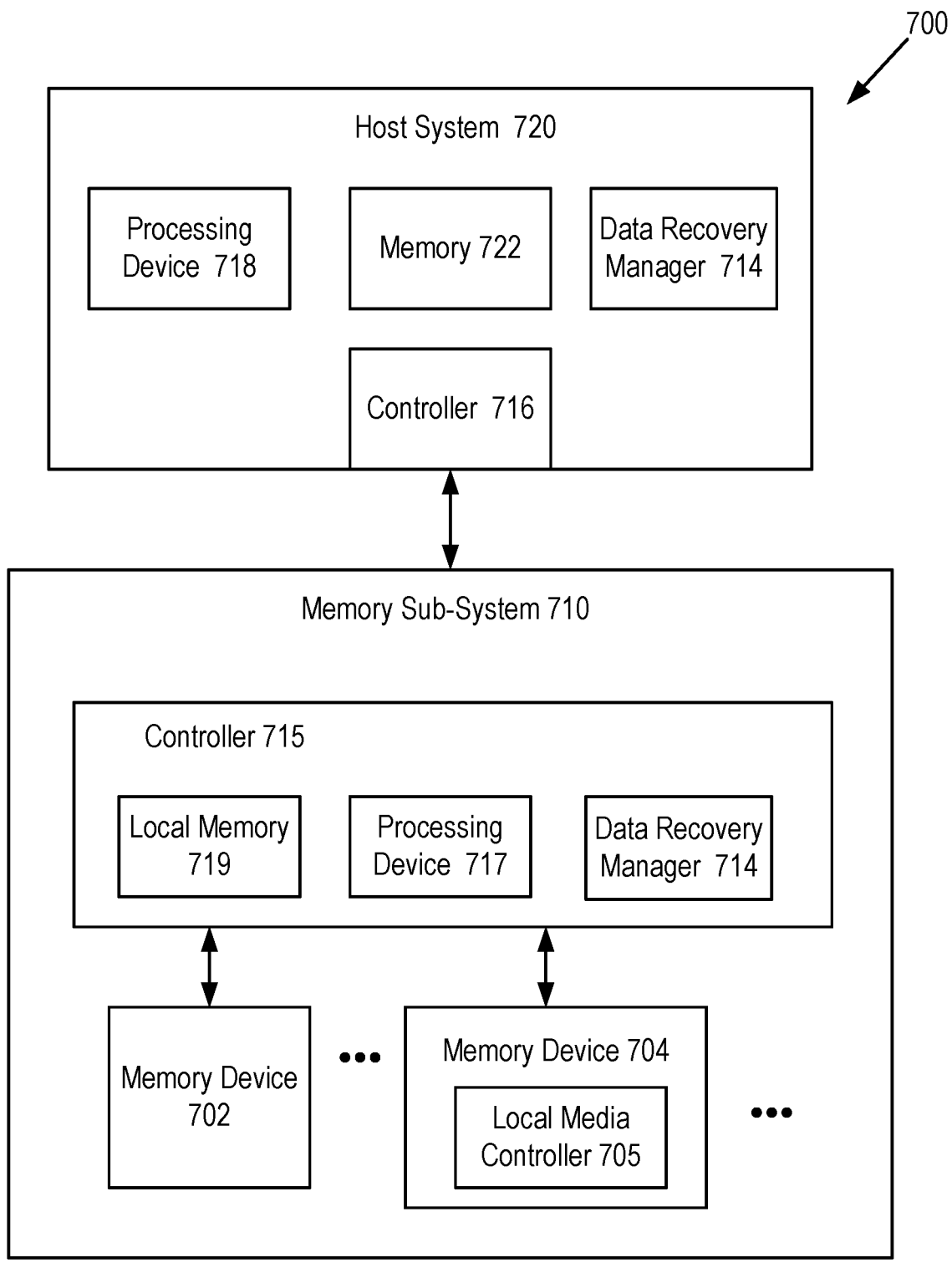
FIG. 6 illustrates an example computing system that includes a memory sub-system in accordance with some embodiments of the present disclosure.

FIG. 6 illustrates an example computing system 700 that includes memory sub-system 710 in accordance with some embodiments of the present disclosure. The memory sub-system 710 can include media, such as one or more volatile memory devices (e.g., memory device 702), one or more non-volatile memory devices (e.g., memory device 704), or a combination of such. Memory device 101 and storage device 301 are examples of memory sub-system 710, and host device 127, 327 is an example of host system 720. Controller 715 is an example of controller 321 or host device 327.

A memory sub-system 710 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 700 can be, for example, a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 700 can include a host system 720 that is coupled to one or more memory sub-systems 710. FIG. 6 illustrates one example of a host system 720 coupled to one memory sub-system 710.

The host system 720 can include a processor chipset (e.g., processing device 718) and a software stack executed by the processor chipset. The processor chipset can include one or more cores, one or more caches, a memory controller (e.g., controller 716) (e.g., NVDIMM controller), and a storage protocol controller (e.g., PCIe controller, SATA controller). The host system 720 uses the memory sub-system 710, for example, to write data to the memory sub-system 710 and read data from the memory sub-system 710.

The host system 720 can be coupled to the memory sub-system 710 via a physical host interface. Examples of a physical host interface include, but are not limited to, a Serial Advanced Technology Attachment (SATA) interface, a Peripheral Component Interconnect Express (PCIe) interface, Universal Serial Bus (USB) interface, Fibre Channel, Serial Attached SCSI (SAS), a Double Data Rate (DDR) memory bus, Small Computer System Interface (SCSI), a Dual In-line Memory Module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 720 and the memory sub-system 710. The host system 720 can further utilize an NVM Express (NVMe) interface to access components (e.g., memory devices 704) when the memory sub-system 710 is coupled with the host system 720 by the PCIe interface. The physical host interface can provide an interface for passing control, address, data, and other signals between the memory sub-system 710 and the host system 720. FIG. 6 illustrates a memory sub-system 710 as an example. In general, the host system 720 can access multiple memory sub-systems via a same communication connection, multiple separate communication connections, and/or a combination of communication connections.

The processing device 718 of the host system 720 can be, for example, a microprocessor, a central processing unit (CPU), a processing core of a processor, an execution unit, etc. In some instances, the controller 716 can be referred to as a memory controller, a memory management unit, and/or an initiator. In one example, the controller 716 controls the communications over a bus coupled between the host system 720 and the memory sub-system 710. In general, the controller 716 can send commands or requests to the memory sub-system 710 for desired access to memory devices 702, 704. The controller 716 can further include interface circuitry to communicate with the memory sub-system 710. The interface circuitry can convert responses received from memory sub-system 710 into information for the host system 720.

The controller 716 of the host system 720 can communicate with controller 715 of the memory sub-system 710 to perform operations such as reading data, writing data, or erasing data at the memory devices 702, 704 and other such operations. In some instances, the controller 716 is integrated within the same package of the processing device 718. In other instances, the controller 716 is separate from the package of the processing device 718. The controller 716 and/or the processing device 718 can include hardware such as one or more integrated circuits (ICs) and/or discrete components, a buffer memory, a cache memory, or a combination thereof. The controller 716 and/or the processing device 718 can be a microcontroller, special purpose logic circuitry (e.g., a Field Programmable Gate Array (FPGA), an Application Specific Integrated Circuit (ASIC), etc.), or another suitable processor.

The memory devices 702, 704 can include any combination of the different types of non-volatile memory components and/or volatile memory components. The volatile memory devices (e.g., memory device 702) can be, but are not limited to, Random Access Memory (RAM), such as Dynamic Random Access Memory (DRAM) and Synchronous Dynamic Random Access Memory (SDRAM).

Some examples of non-volatile memory components include a Negative-AND (NAND) type flash memory and write-in-place memory, such as three-dimensional cross point memory. A cross point array of non-volatile memory can perform bit storage based on a change of bulk resistance, in conjunction with a stackable cross-gridded data access array. Additionally, in contrast to many flash-based memories, cross point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 704 can include one or more arrays of memory cells (e.g., memory cells 105, 107). One type of memory cell, for example, Single Level Cells (SLCs) can store one bit per cell. Other types of memory cells, such as Multi-Level Cells (MLCs), Triple Level Cells (TLCs), Quad-Level Cells (QLCs), and penta-level cells (PLCs) can store multiple bits per cell. In some embodiments, each of the memory devices 704 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 704 can be grouped as pages that can refer to a logical unit of the memory device used to store data. With some types of memory (e.g., NAND), pages can be grouped to form blocks.

Although non-volatile memory devices such as 3D cross point type and NAND type memory (e.g., 2D NAND, 3D NAND) are described, the memory device 704 can be based on any other type of non-volatile memory, such as Read-Only Memory (ROM), Phase Change Memory (PCM), self-selecting memory, other chalcogenide based memories, Ferroelectric Transistor Random-Access Memory (FeTRAM), Ferroelectric Random Access Memory (FeRAM), Magneto Random Access Memory (MRAM), Spin Transfer Torque (STT)-MRAM, Conductive Bridging RAM (CBRAM), Resistive Random Access Memory (RRAM), Oxide based RRAM (OxRAM), Negative-OR (NOR) flash memory, and Electrically Erasable Programmable Read-Only Memory (EEPROM).

A memory sub-system controller 715 (or controller 715 for simplicity) can communicate with the memory devices 704 to perform operations such as reading data, writing data, or erasing data at the memory devices 704 and other such operations (e.g., in response to commands scheduled on a command bus by controller 716). The controller 715 can include hardware such as one or more Integrated Circuits (ICs) and/or discrete components, a buffer memory, or a combination thereof. The hardware can include digital circuitry with dedicated (i.e., hard-coded) logic to perform the operations described herein. The controller 715 can be a microcontroller, special purpose logic circuitry (e.g., a Field Programmable Gate Array (FPGA), an Application Specific Integrated Circuit (ASIC), etc.), or another suitable processor.

The controller 715 can include a processing device 717 (processor) configured to execute instructions stored in a local memory 719. In the illustrated example, the local memory 719 of the controller 715 includes an embedded memory configured to store instructions for performing various processes, operations, logic flows, and routines that control operation of the memory sub-system 710, including handling communications between the memory sub-system 710 and the host system 720.

In some embodiments, the local memory 719 can include memory registers storing memory pointers, fetched data, etc. The local memory 719 can also include Read-Only Memory (ROM) for storing micro-code. While the example memory sub-system 710 in FIG. 6 has been illustrated as including the controller 715, in another embodiment of the present disclosure, a memory sub-system 710 does not include a controller 715, and can instead rely upon external control (e.g., provided by an external host, or by a processor or controller separate from the memory sub-system).

In general, the controller 715 can receive commands or operations from the host system 720 and can convert the commands or operations into instructions or appropriate commands to achieve the desired access to the memory devices 704. The controller 715 can be responsible for other operations such as wear leveling operations, garbage collection operations, error detection and error correction code (ECC) operations, encryption operations, caching operations, and address translations between a logical address (e.g., Logical Block Address (LBA), namespace) and a physical address (e.g., physical block address) that are associated with the memory devices 704.

The controller 715 can further include host interface circuitry to communicate with the host system 720 via the physical host interface. The host interface circuitry can convert the commands received from the host system into command instructions to access the memory devices 704 as well as convert responses associated with the memory devices 704 into information for the host system 720.

The memory sub-system 710 can also include additional circuitry or components that are not illustrated. In some embodiments, the memory sub-system 710 can include a cache or buffer (e.g., DRAM) and address circuitry (e.g., a row decoder and a column decoder) that can receive an address from the controller 715 and decode the address to access the memory devices 704.

In some embodiments, the memory devices 704 include local media controllers 705 that operate in conjunction with memory sub-system controller 715 to execute operations on one or more memory cells of the memory devices 704. An external controller (e.g., memory sub-system controller 715) can externally manage the memory device 704 (e.g., perform media management operations on the memory device 704). In some embodiments, a memory device 704 is a managed memory device, which is a raw memory device combined with a local controller (e.g., local controller 705) for media management within the same memory device package. An example of a managed memory device is a Managed NAND (MNAND) device.

In one embodiment, the computing system 700 includes a data recovery manager 714 in the memory sub-system 710 that corrects data read from memory (e.g., corrects data as described for FIG. 4 or 5). In some embodiments, the controller 715 in the memory sub-system 710 includes at least a portion of the data recovery manager 714. In other embodiments, or in combination, the controller 716 and/or the processing device 718 in the host system 720 includes at least a portion of the data recovery manager 714. For example, the controller 715, the controller 716, and/or the processing device 718 can include logic circuitry implementing the data recovery manager 714. For example, the controller 715, or the processing device 718 (processor) of the host system 720, can be configured to execute instructions stored in memory for performing the operations of the data recovery manager 714.

In some embodiments, the data recovery manager 714 is implemented in an integrated circuit chip disposed in the memory sub-system 710. In other embodiments, the data recovery manager 714 is part of an operating system of the host system 720, a device driver, or an application.

In some implementations, a communication channel between the processing device 718 and a memory sub-system 710 includes a computer network, such as a local area network, a wireless local area network, a wireless personal area network, a cellular communications network, a broadband high-speed always-connected wireless communication connection (e.g., a mobile network link); and the processing device 718 and the memory sub-system can be configured to communicate with each other using data storage management and usage commands similar to those in NVMe protocol.

A memory sub-system 710 in general can have non-volatile storage media. Examples of non-volatile storage media include memory cells formed in an integrated circuit and magnetic material coated on rigid disks. Non-volatile storage media can maintain the data/information stored therein without consuming power. Memory cells can be implemented using various memory/storage technologies, such as NAND logic gate, NOR logic gate, Phase-Change Memory (PCM), Magnetic Random Access Memory (MRAM), resistive random-access memory, cross point storage and memory devices. A cross point memory device uses transistor-less memory elements, each of which has a memory cell and a selector that are stacked together as a column. Memory element columns are connected via two perpendicular lays of wires, where one lay is above the memory element columns and the other lay below the memory element columns. Each memory element can be individually selected at a cross point of one wire on each of the two layers. Cross point memory devices are fast and non-volatile and can be used as a unified memory pool for processing and storage.

The controller (e.g., 715) of a memory sub-system (e.g., 710) can run firmware to perform operations responsive to the communications from the processing device 718. Firmware in general is a type of computer program that provides control, monitoring and data manipulation of engineered computing devices.

Some embodiments involving the operation of the controller 715 can be implemented using computer instructions executed by the controller 715, such as the firmware of the controller 715. In some instances, hardware circuits can be used to implement at least some of the functions. The firmware can be initially stored in the non-volatile storage media, or another non-volatile device, and loaded into the volatile DRAM and/or the in-processor cache memory for execution by the controller 715.

A non-transitory computer-readable medium can be used to store instructions of the firmware of a memory sub-system (e.g., 710). When the instructions are executed by the controller 715 and/or the processing device 717, the instructions cause the controller 715 and/or the processing device 717 to perform a method discussed herein.

In one embodiment, a method (e.g., implemented in memory sub-system 710) manages data recovery to correct stuck bit errors in stored data (e.g., correcting stuck bit errors as described for FIGS. 1-3). The method can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method is performed at least in part by the data recovery manager 714 of FIG. 6. For example, the method can be performed to recover data stored in memory cells 105 or 107 (e.g., in one or more media units, such as integrated circuit dies), then retrieved from the memory cells 105, 107, and then found to include errors (e.g., due to failing bits).

Figure 7:
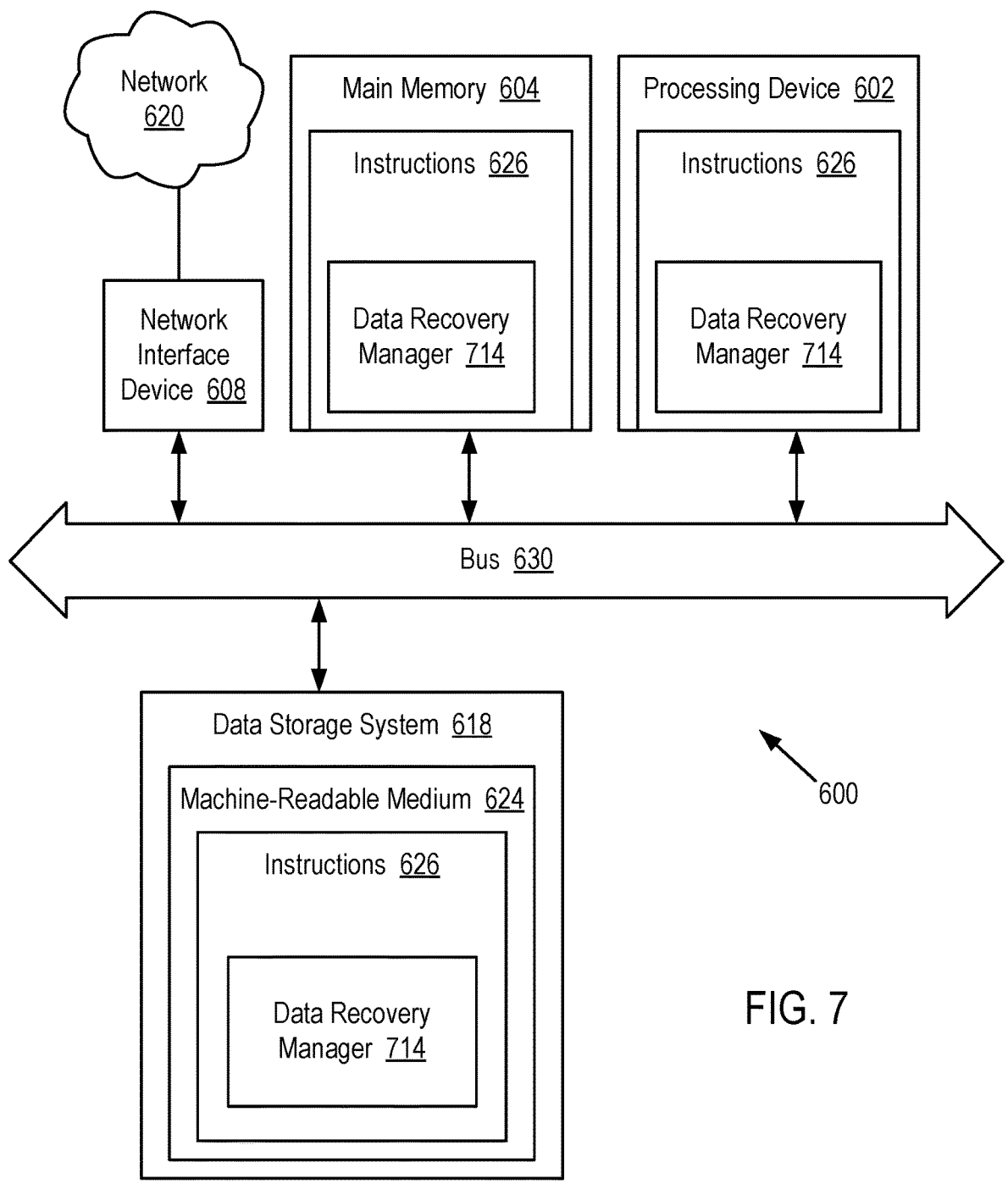
FIG. 7 is a block diagram of an example computer system in which embodiments of the present disclosure can operate.

FIG. 7 illustrates an example machine of a computer system 600 within which a set of instructions, for causing the machine to perform any one or more of the methodologies discussed herein, can be executed. In some embodiments, the computer system 600 can correspond to a host system (e.g., the host system 720 of FIG. 6) that includes, is coupled to, or utilizes a memory sub-system (e.g., the memory sub-system 710 of FIG. 6), or can be used to perform the operations of data recovery manager 714 (e.g., to execute instructions to perform operations corresponding to the data recovery manager 714 described with reference to FIG. 6). In one example, computer system 600 corresponds to host system 127 or 327.

In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 618, which communicate with each other via a bus 630 (which can include multiple buses).

In various embodiments, processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also referred to as a computer-readable medium herein) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 710 of FIG. 6. In one embodiment, the instructions 626 include instructions to implement functionality corresponding to, for example, multi-level parity protection and further supported by a data recovery manager to correct errors due to stuck bits (e.g., the data recovery manager 714 described with reference to FIG. 6).

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a processing device or computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

The term "computer-readable medium" or the like as used herein includes a single medium or multiple media that store one or more sets of instructions. Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player.

Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A system comprising:
   at least one memory configured to store data; and
   at least one processing device configured to:
     read first data from the memory;
     detect at least one error in the first data;
     in response to detecting the error, write a data pattern to the memory.

2. The system of claim 1, further comprising at least one sensor, wherein the processing device is further configured to:
   receive sensor data from the sensor; and
   select, based on the sensor data, the data pattern for writing to the memory.

3. The system of claim 1, further comprising a counter, wherein the processing device is further configured to:
   determine an extent of use of the memory based on the counter; and
   select, based on the determined extent of use, the data pattern for writing to the memory.

4. The system of claim 1, wherein the processing device is further configured to:
   generate an output from an artificial neural network, the output associated with an age of the memory; and
   select, based on the output, the data pattern for writing to the memory.

5. The system of claim 1, wherein the processing device is further configured to, in response to detecting the error in the first data, change a timing for writing the data pattern.

6. The system of claim 1, wherein the processing device is further configured to, in response to detecting the error in the first data, change a timing for reading the data pattern.

7. The system of claim 1, wherein the processing device is further configured to:
   read the data pattern from the memory;
   identify at least one failing bit in the read data pattern;
   wherein correcting the error comprises, in response to identifying the failing bit in the read data pattern, correcting a failing bit in the first data that corresponds to the identified failing bit.

8. The system of claim 1, wherein the processing device is further configured to:
   determine a bit location of a failing bit in the data pattern;
   wherein correcting the error comprises, correcting the error at the bit location in the first data.

9. The system of claim 8, wherein the error is corrected by flipping a bit at the bit location.

10. The system of claim 1, wherein the error is detected using an error correction code, and the processing device is further configured to determine that the detected error exceeds a correction capability of the error correction code.

11. The system of claim 1, wherein the first data is a portion of a page of data read from the memory, and the processing device is further configured to:
    in response to detecting the error in the first data, change a mapping of the page.

12. The system of claim 1, wherein the processing device is further configured to:
    in response to detecting the error in the first data, retire a page of data that includes the first data.

13. A system comprising:
    memory configured to store data; and
    a controller configured to:
      read first data from the memory;
      detect at least one error in the first data; and
      in response to detecting the error, write a first pattern to the memory;
      read the first pattern from the memory.

14. The system of claim 13, wherein the controller is further configured to in response to determining that the read first pattern does not include any bit error, write a second pattern to the memory, wherein the second pattern is an inverse of the first pattern.

15. The system of claim 13, wherein the first data is read in response to receiving a read command from a host device, and the controller is further configured to send corrected first data to the host device in reply to the read command.

16. The system of claim 13, further comprising an error correction code (ECC) decoder, wherein the ECC decoder is configured to detect the error in the first data.

17. The system of claim 13, wherein:
    the first data includes an error caused by a failing bit, and at least one other bit error; and
    the controller is further configured to correct the other bit error using an error correction code.

18. A system comprising:
    at least one memory configured to store data;
    a decoder configured to detect errors in data read from the memory; and
    a controller configured to:
      read first data from a first location in the memory;
      detect, using the decoder, at least one error in the first data; and
      in response to detecting the error, write a plurality of data patterns to the memory at the first location.

19. The system of claim 18, wherein:
    writing the data patterns comprises writing a first data pattern and a second data pattern; and
    the second data pattern is written in response to a failure to identify any error when reading the first data pattern.

20. The system of claim 18, further comprising a buffer, wherein the corrected data is written from the buffer to the memory at the first location.

* * * * *